United States Patent
Tan

(10) Patent No.: US 8,218,309 B2
(45) Date of Patent: Jul. 10, 2012

(54) HARD DISK BACKPLANE STRUCTURE AND HARD DISK COOLING ASSEMBLY USING THE SAME

(75) Inventor: Zeu-Chia Tan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 82 days.

(21) Appl. No.: 12/791,062

(22) Filed: Jun. 1, 2010

(65) Prior Publication Data

US 2011/0235263 A1    Sep. 29, 2011

(30) Foreign Application Priority Data

Mar. 29, 2010  (TW) ................................ 99109474 A

(51) Int. Cl.
  *G06F 1/16*    (2006.01)
(52) U.S. Cl. ................ 361/679.33; 248/680; 360/98.04; 312/213
(58) Field of Classification Search ..................... 248/60, 248/631, 636, 308.3, 544, 680; 360/97.02, 360/245.8, 314, 224, 265.1, 75, 99.12, 97.01, 98.04; 361/679.39, 679.21, 679.33, 679.31, 679.08, 679.02, 679.09, 679.34, 679.35; 312/223.1, 223.2, 237, 219, 213, 7.2
See application file for complete search history.

(56) References Cited

U.S. PATENT DOCUMENTS

| | | | | |
|---|---|---|---|---|
| 5,227,957 A * | 7/1993 | Deters | ...................... | 361/679.32 |
| 5,706,179 A * | 1/1998 | Palatov | .......................... | 361/788 |
| 6,272,007 B1 * | 8/2001 | Kitlas et al. | .............. | 361/679.32 |

* cited by examiner

*Primary Examiner* — Hung Duong
(74) *Attorney, Agent, or Firm* — Altis Law Group, Inc.

(57) ABSTRACT

A hard disk backplane structure includes a main body and an additional board. The hard disk backplane structure includes a first side surface and second side surface adjacent to the first side surface and a backplane connector. The additional board includes a receptacle for connection with an additional electrical component. A hard disk cooling assembly using the hard disk backplane structure is also provided in the disclosure.

9 Claims, 3 Drawing Sheets

HARD DISK BACKPLANE STRUCTURE AND HARD DISK COOLING ASSEMBLY USING THE SAME

BACKGROUND

1. Technical Field

The present disclosure relates to a hard disk backplane structure and a hard disk cooling assembly using the structure.

2. Description of the Related Art

A typical hard disk backplane structure for mounting a plurality of hard disks includes a printed circuit board (PCB). The PCB includes a plurality of data connectors and power receptacles. The hard disks are positioned at a side of the PCB, and each hard disk is connected to a data connector and a power receptacle, for receiving data and electrical power from the hard disk backplane structure. The PCB further defines a connecting slot for receiving an expansion card or other additional electrical components.

When the hard disk backplane structure is mounted in a computer case, a fan of the computer is generally positioned at the other side of the hard disk backplane structure away from the hard disk due to the limitation of space in the computer case. Airflow created by the fan should flow to the hard disks, but is often blocked by the additional electrical components on the printed circuit board, resulting in low cooling efficiency.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views, and both the views are schematic.

DETAILED DESCRIPTION

Figure 1:
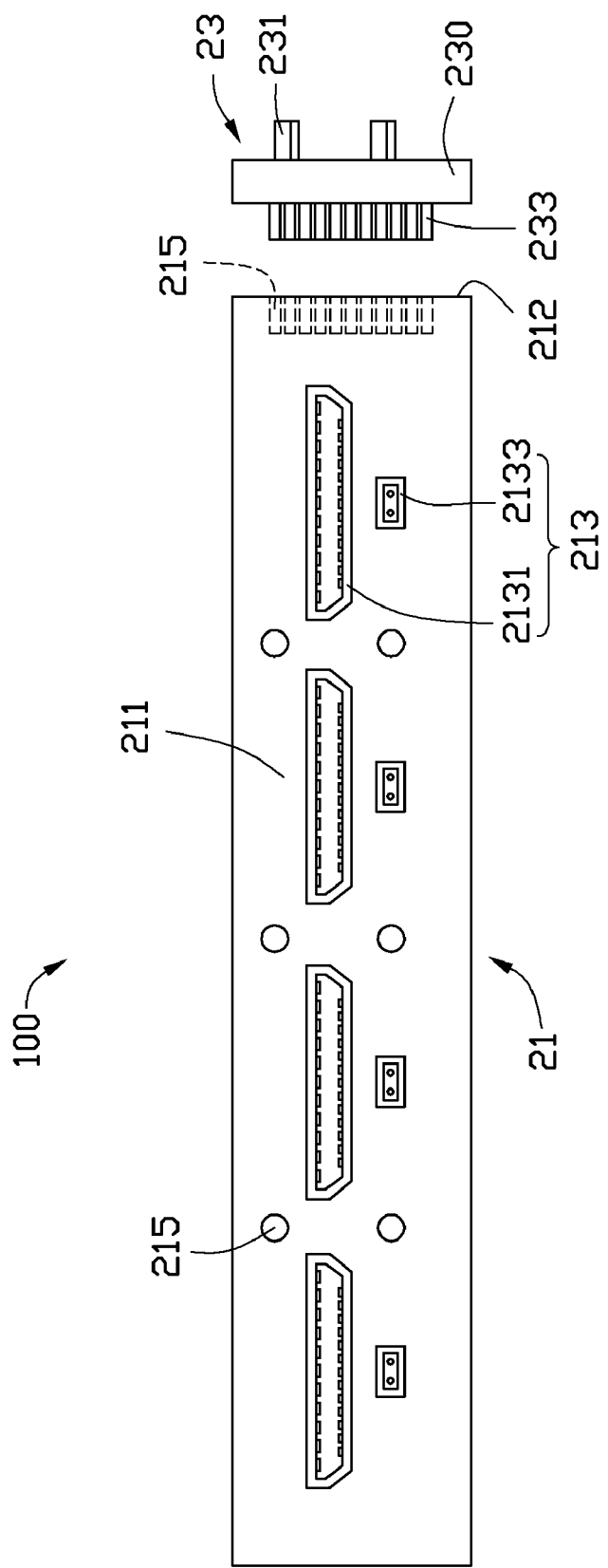
FIG. 1 is a plane view of an embodiment of a hard disk backplane structure.
Figure 2:
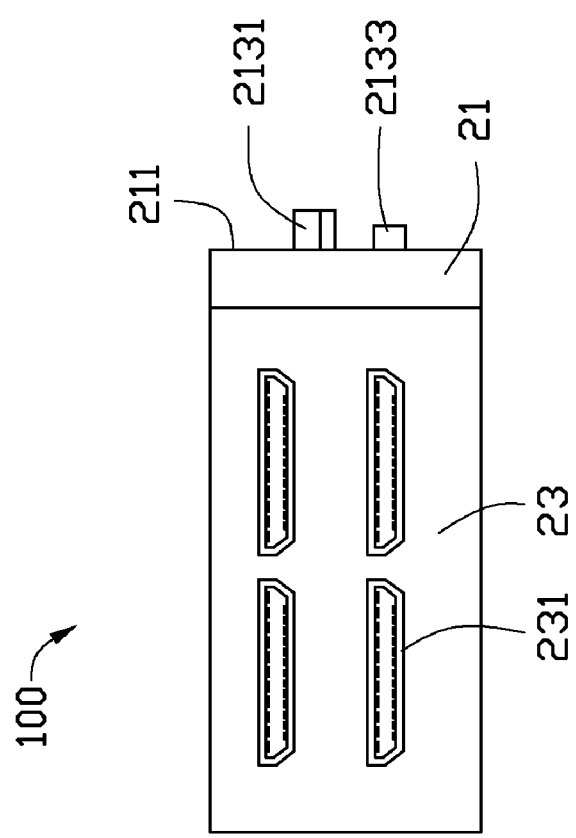
FIG. 2 is a side view of the hard disk backplane structure shown in FIG. 1.

Referring to FIGS. 1 and 2, an exemplary embodiment of a hard disk backplane structure 100 includes a main body 21 and an additional board 23. The main body 21 can be a substantially rectangular printed circuit board (PCB). The main body 21 includes a first side surface 211, a second side surface 212 adjacent to the first side surface 211, and for example, four backplane connectors 213 positioned on the first side surface 211 in a row. The first side surface 211 is substantially perpendicular to the second side surface 212. The main body 21 defines a connecting slot 215 for mounting the additional board 23 at the second side surface 211. Each backplane connector 213 includes a data connector 2131 and a power receptacle 2133. The backplane connectors 213 are connected to hard disks 33 (shown in FIG. 3), to receive electrical power from the hard disk backplane structure 100, and transmit data between the hard disk backplane structure 100 and the hard disks 33. In the illustrated exemplary embodiment, the number of the backplane connectors 213 is four, for mounting four hard disks 33. In alternative embodiments, the number of backplane connectors 213 may be one or more according to the number of the hard disks 33.

The additional board 23 includes a base 230, a plurality of additional receptacles 231 positioned on a side of the base 230 and a golden finger 233 positioned on the opposite side of the base 230 from the additional receptacles 231. The additional receptacles 231 are used for mounting or connecting additional electrical components, such as serial attached small computer system interface (SAS) card, SAS integrated circuit card or SAS controlling integrated circuit card. The golden finger 233 is inserted in the connecting slot 215 to mount the additional board 23 on the main body 21. In the illustrated embodiment, the additional board 23 is a flexible PCB, to reduce the cost of the hard disk backplane structure 100.

Figure 3:
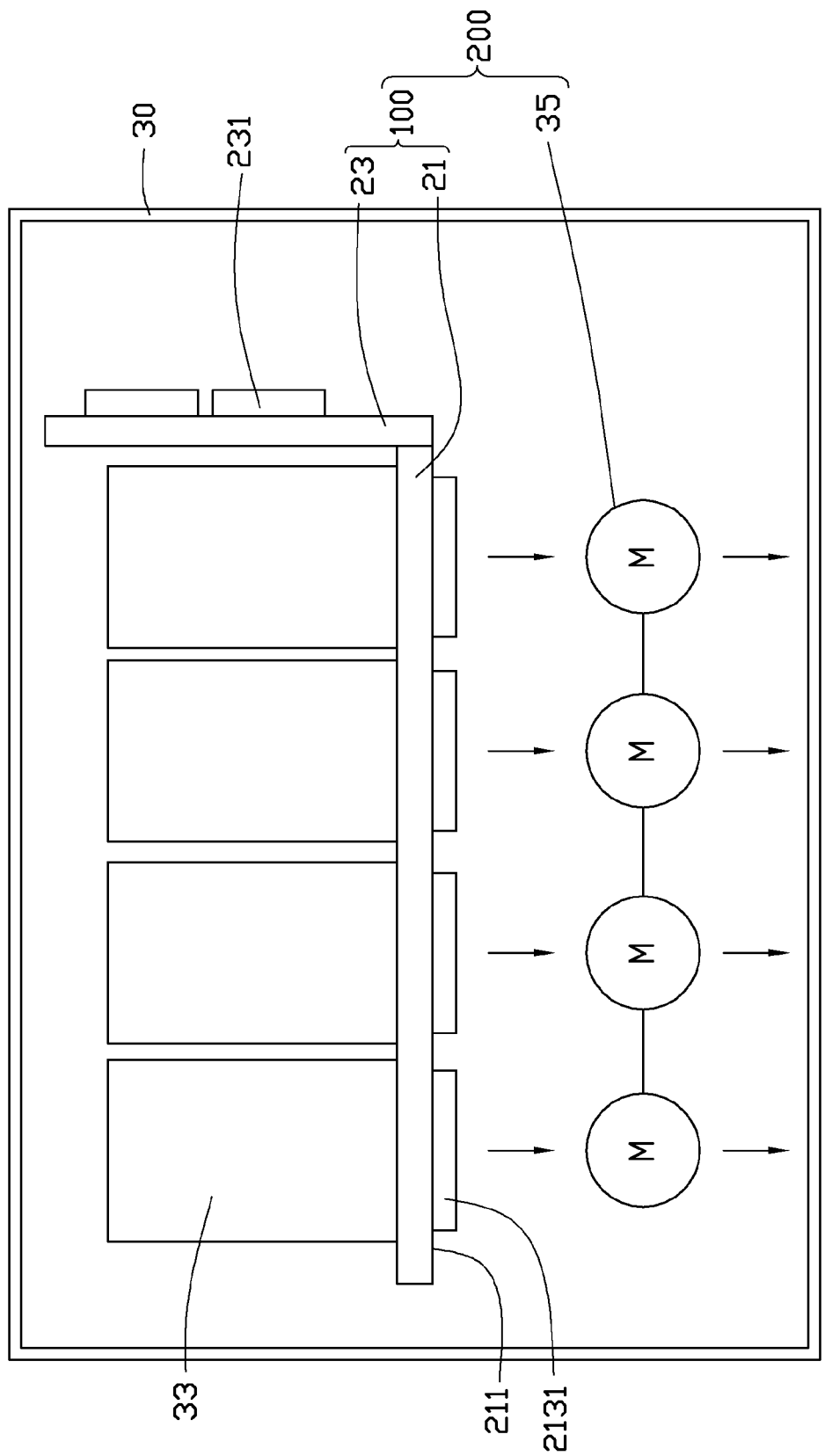
FIG. 3 is a plane view of a hard disk cooling assembly using the hard disk backplane structure shown in FIG. 1.

Referring to FIG. 3, the exemplary embodiment of a hard disk cooling assembly 200 using the hard disk backplane structure 100 is shown positioned in a computer case 30. The hard disk cooling assembly 200 further includes a plurality of spaced fans 35 adjacent to the backplane connectors 213. The hard disks 33 are mounted on a side surface of the main body 21 opposite to the first side surface 211, and each hard disk 33 is connected to a backplane connector 213 correspondingly by a circuit in the main body 21. The fans 35 create airflow across the hard disks 33 to the main body 21 for cooling the hard disks 33. The additional board 23 is positioned out of the way of the airflow to the hard disks 33. The hard disk backplane structure 100 includes an additional board 23 for mounting the additional electrical components, and the main body 21 may define cooling holes 215 (shown in FIG. 1) to further improve the cooling ability of hard disk backplane structure 100.

Finally, while particular embodiments have been described, the description is illustrative and is not to be construed as limiting. For example, various modifications can be made to the embodiments by those of ordinary skill in the art without departing from the true spirit and scope of the invention as defined by the appended claims.

What is claimed is:

1. A hard disk backplane structure comprising:
    a main body comprising a first side surface, a second side surface adjacent to the first side surface, and a backplane connector positioned on the first side surface; and
    an additional board connected to the second side surface, the additional board comprising a receptacle for connection with an additional electrical component, wherein the additional board forms a golden finger at a side; the main body defines a connecting slot in the second side surface, the golden finger is received in the connecting slot.

2. The hard disk backplane structure of claim 1, wherein the additional board is flexible printed circuit board.

3. The hard disk backplane structure of claim 1, wherein the main body defines at least one cooling hole.

4. The hard disk backplane structure of claim 1, wherein the first side surface is substantially perpendicular to the second side surface.

5. A hard disk cooling assembly comprising:
    a fan; and
    a hard disk backplane structure comprising:
        a main body comprising a first side surface, a second side surface, and a backplane connector positioned on the first side surface; and
    an additional board comprising a receptacle for connection with an additional electrical component;
    wherein the fan is positioned at a side of the main body adjacent to the first side surface.

6. The hard disk cooling assembly of claim 5, wherein the additional board forms a golden finger at a side; the main body defines a connecting slot in the second side surface for receiving the golden finger.

7. The hard disk cooling assembly of claim 5, wherein the additional board is a flexible printed circuit board.

8. The hard disk cooling assembly of claim 5, wherein the main body defines at least one cooling hole.

9. The hard disk cooling assembly of claim 5, wherein the first side surface is perpendicular to the second side surface.

* * * * *